United States Patent
Ha

(10) Patent No.: US 10,050,225 B2
(45) Date of Patent: Aug. 14, 2018

(54) ORGANIC LIGHT EMITTING DIODE DISPLAY

(75) Inventor: Kuen-Dong Ha, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 995 days.

(21) Appl. No.: 13/189,974

(22) Filed: Jul. 25, 2011

(65) Prior Publication Data

US 2012/0132932 A1    May 31, 2012

(30) Foreign Application Priority Data

Nov. 29, 2010   (KR) .................. 10-2010-0119886

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC ...... *H01L 51/5253* (2013.01); *H01L 51/5243* (2013.01); *H01L 2251/55* (2013.01)

(58) Field of Classification Search
CPC .................. H01L 51/5243; H01L 51/5253
USPC ............................................ 257/40, E51.02
See application file for complete search history.

(56) References Cited

U.S. PATENT DOCUMENTS

| | | | | |
|---|---|---|---|---|
| 4,767,679 A | * | 8/1988 | Kawachi | 428/690 |
| 7,534,635 B1 | * | 5/2009 | Foust et al. | 438/25 |
| 8,445,899 B2 | | 5/2013 | Murayama et al. | |
| 2002/0044441 A1 | * | 4/2002 | Park | 362/84 |
| 2002/0070663 A1 | * | 6/2002 | Ogura et al. | 313/506 |
| 2005/0051327 A1 | * | 3/2005 | Vinegar et al. | 166/256 |
| 2009/0261719 A1 | * | 10/2009 | Nimura et al. | 313/504 |
| 2010/0300746 A1 | * | 12/2010 | MacKenzie et al. | 174/525 |
| 2011/0187629 A1 | * | 8/2011 | Nam | H01L 51/5243 345/76 |
| 2011/0193067 A1 | * | 8/2011 | Lee et al. | 257/40 |

FOREIGN PATENT DOCUMENTS

| | | |
|---|---|---|
| JP | 4254154 | 3/2004 |
| JP | 2006003775 | 1/2006 |
| JP | 5660030 | 1/2015 |
| KR | 1020070085333 | 8/2007 |
| KR | 1020090026421 | 3/2009 |
| KR | 1020090027432 | 3/2009 |
| KR | 1020100053233 | 5/2010 |
| WO | WO 2010/106853 | 9/2010 |

* cited by examiner

*Primary Examiner* — Hsin-Yi Hsieh
(74) *Attorney, Agent, or Firm* — Knobbe Martens Olson & Bear LLP

(57) ABSTRACT

An organic light emitting diode display is disclosed. The organic light emitting diode display includes: a substrate, an organic light emitting diode positioned on the substrate, a metal layer positioned on the substrate with the organic light emitting diode interposed therebetween, and a resin layer positioned on the metal layer and configured to reinforce a strength of the metal layer.

10 Claims, 11 Drawing Sheets

FIG.6

| case | AL-PET | Al-Sheet | AL-PET | AL-PET | In-PET |
|---|---|---|---|---|---|
| metal t (mm) | 0.03 | 0.03 | 0.1 | 0.03 | 0.1 |
| PET t (mm) | 0.03 | - | - | 0.025 | 0.1 |
| glass t (mm) | 0.5 | | | 1.1 | 1.1 |
| 100 → Tf (°C) | 20 | | | | |
| Cooling deformation (mm) | 138.1 | 10.3 | 122.6 | 37.2 | -2.4 |
| Deformation mode | Y | C | X | Y | C |
| glass stress(MPa) | 24.6 | 24.3 | 54.2 | 12.5 | 2.1 |
| matal stress(MPa) | 137.4 | 344 | 318 | 154 | 39 |

FIG.7

| case | AL-PET | IN-PET | | | | | | | |
|---|---|---|---|---|---|---|---|---|---|
| Aluminum t (mm) | 0.03 | | | | | | | | |
| INVAR t (mm) | | 1 | 0.8 | 0.3 | 0.2 | 0.1 | 0 | 0.1 | 0.05 |
| PET t (mm) | 0.025 | | | | | 0.1 | | | 0.05 |
| glass t (mm) | 1.1 | | | | 1.1 | | | 0.1 | |
| Cooling deformation (mm) | 37.2 | 171 | 141 | 39.3 | 17.8 | -2.4 | -21 | 8.9 | 2.5 |
| Deformation mode | Y | Y | Y | Y | Y | C | Y | Y | C |
| glass stress (MPa) | 12.5 | 84.6 | 67.1 | 16.5 | 7.6 | 2.1 | 12.8 | 3.3 | 1.6 |
| Metal stress (MPa) | 154 | 310 | 268 | 133 | 101.2 | 60 | 38 | 68.5 | 48.9 |

FIG.8

| case | AL-PET case | IN-PET | | | |
|---|---|---|---|---|---|
| Aluminum t (mm) | 0.03 | | | | |
| INVAR t (mm) | | 0.1 | 0.1 | 0.1 | 0.05 |
| PET t (mm) | 0.025 | 0.2 | 0.1 | 0.1 | 0.05 |
| glass t (mm) | 1.1 | | | 0.7 | |
| Cooling deformation (mm) | 37.2 | 43.3 | -1.0 | 22.0 | -3.7 |
| Deformation mode | Y | Y | C | Y | C |
| glass stress(MPa) | 12.5 | 14.5 | 2.1 | 6.03 | 1.7 |
| Metal stress(MPa) | 154 | 105.1 | 60.0 | 73.7 | 48.6 |

FIG.9

|  | CTE(ppm/°C) | E(MPa) |
|---|---|---|
| FRP | 30 | 11000 |
| PMMA | 41 | 3300 |
| PET | 60 | 5300 |
| INVAR | 0.6 | 140000 |
| GLASS | 3.8 | 73000 |

FIG.10

| case | | | | IN-PET | | |
|---|---|---|---|---|---|---|
| INVAR t (mm) | 0.1 | 0.1 | INVAR t (mm) | | 0.1 | |
| FRP t (mm) | 0.1 | 0.15 | PMMA t (mm) | 0.2 | 0.15 | 0.25 |
| glass t (mm) | 1.1 | 1.1 | glass t (mm) | | 1.1 | |
| Cooling deformation (mm) | -3.9 | 3.8 | Cooling deformation (mm) | -12.7 | -8.4 | 0.8 |
| Deformation mode | C | C | Deformation mode | Y | Y | C |
| glass stress(MPa) | 3.0 | 2.9 | glass stress(MPa) | 8.2 | 5.6 | 2.0 |
| Metal stress(MPa) | 47.1 | 55.5 | Metal stress(MPa) | 42.1 | 44.7 | 52.3 |

FIG.11

|  | Experiment | Equation 2 | Equation 3 |
|---|---|---|---|
| PET t (mm) | 0.1 | 0.15 | 0.08 ～ 0.23 |
| FRP t (mm) | 0.15 | 0.155 | 0.08 ～ 0.23 |
| PMMA t (mm) | 0.25 | 0.365 | 0.18 ～ 0.55 |

ORGANIC LIGHT EMITTING DIODE DISPLAY

CROSS-REFERENCE TO RELATED APPLICATIONS

This application claims priority to and the benefit of Korean Patent Application No. 10-2010-0119886 filed in the Korean Intellectual Property Office on Nov. 29, 2010, the entire contents of which are incorporated herein by reference.

BACKGROUND

Field

The described technology relates generally to an organic light emitting diode display, and more particularly, to an organic light emitting diode display encapsulating an organic light emitting diode using a metal layer.

Description of the Related Technology

Display devices display images and recently, an organic light emitting diode display has been in the spotlight.

The organic light emitting diode display, unlike a liquid crystal display, has a self-emitting characteristic and does not need a separate light source such that its thickness and weight are decreased. In addition, the organic light emitting diode display has high-grade characteristics such as low power consumption, high luminance, high reaction speed, and the like.

In general, the organic light emitting diode display includes a substrate, an organic light emitting diode positioned on the substrate, an encapsulant encapsulating the organic light emitting diode, and a sealant bonding the substrate and the encapsulant. Recently, an opaque metal layer has been used as an encapsulant.

The sealant bonding the opaque encapsulant and the substrate can include a thermosetting resin, but at least one of the encapsulant and the substrate is deformed by the heat used as a curing means to cure the sealant.

The above information disclosed in this Background section is only for enhancement of understanding of the background of the described technology and therefore it can contain information that does not form the prior art that is already known in this country to a person of ordinary skill in the art.

SUMMARY OF CERTAIN INVENTIVE ASPECTS

The described technology has been made in an effort to provide an organic light emitting diode display having an advantage of minimizing the deformation due to heat.

One embodiment provides an organic light emitting diode display including a substrate; an organic light emitting diode positioned on the substrate a metal layer positioned on the substrate with the organic light emitting diode interposed therebetween and a resin layer positioned on the metal layer and configured to reinforce a strength of the metal layer.

The metal layer can have a lower thermal expansion coefficient than a thermal expansion coefficient of the substrate.

The resin layer can be attached to the metal layer.

The organic light emitting diode display can satisfy the following equation:

$$[\{E2*t2*(a3-a2)\}/\{E1*(a1-a3)\}]*0.5 \leq t1 \leq [\{E2*t2*(a3-a2)\}/\{E1*(a1-a3)\}]*1.5$$

where, t1 is a thickness of the resin layer, a1 is a thermal expansion coefficient of the resin layer, E1 is an elastic coefficient of the resin layer, t2 is a thickness of the metal layer, a2 is a thermal expansion coefficient of the metal layer, E2 is an elastic coefficient of the metal layer, and a3 is a thermal expansion coefficient of the substrate.

The substrate can include glass and the metal layer can include nickel and iron.

The thermal expansion coefficient of the substrate can be about 3.8 ppm/° C., the elastic coefficient can be about 73000 Mpa, and the thickness can be in the range of about 0.7 mm to about 1.1 mm.

The thermal expansion coefficient of the metal layer can be about 0.6 ppm/° C., the elastic coefficient can be about 140000 Mpa, and the thickness can be in the range of about 0.05 mm to about 0.1 mm.

The resin layer can include at least one of glass fiber reinforced plastic (FRP), polyethyleneterephthalate (PET), and polymethylmethacrylate (PMMA).

The thermal expansion coefficient of the resin layer can be between about 30 and about 60 ppm/° C., the elastic coefficient can be between about 3300 Mpa and about 11000 Mpa, and the thickness can be in the range of about 0.05 mm to about 0.1 mm.

The organic light emitting diode display can further include an adhesive layer positioned between the substrate and the metal layer with the organic light emitting diode interposed therebetween and configured to bond and seal the substrate and the metal layer with each other.

The adhesive layer can include a thermosetting resin.

According to certain embodiments, the organic light emitting diode display capable of minimizing the deformation due to a heat is provided.

BRIEF DESCRIPTION OF THE DRAWINGS

FIGS. 5 to 11 are diagrams describing experiments drawn using an embodiment of an organic light emitting diode display.

DETAILED DESCRIPTION OF CERTAIN INVENTIVE EMBODIMENTS

Figure 1:
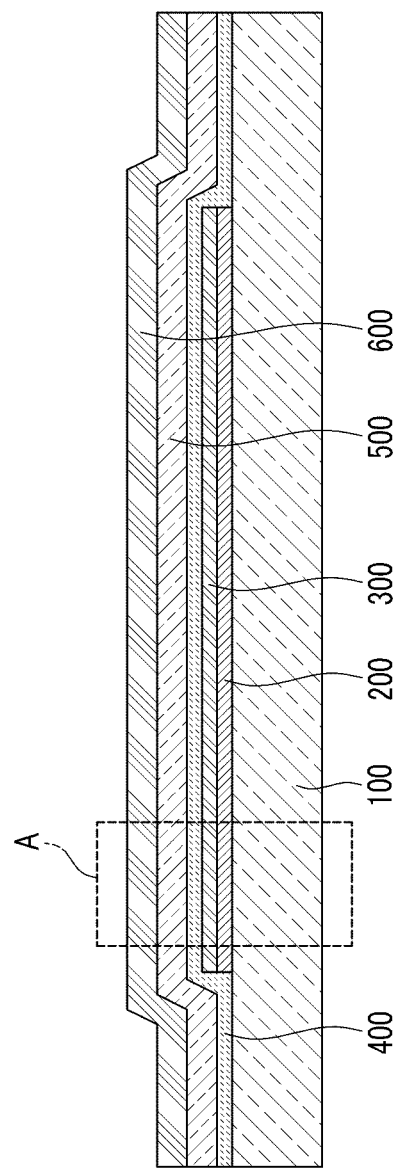
FIG. 1 is a cross-sectional view illustrating an embodiment of an organic light emitting diode display.

The present invention will be described more fully hereinafter with reference to the accompanying drawings, in which certain embodiments of the invention are shown. As those skilled in the art would realize, the described embodiments can be modified in various ways, without departing from the spirit or scope of the present invention.

The drawings and description are to be regarded as illustrative in nature and not restrictive. Like reference numerals generally designate like elements throughout the specification.

In addition, the size and thickness of each component shown in the drawings are arbitrarily shown for understanding and ease of description, but the present invention is not limited thereto.

In the drawings, the thickness of layers, areas, films, panels, regions, etc., can be exaggerated for clarity. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising", will be understood to imply the inclusion of stated elements but not the exclusion of any other elements. Further, throughout the specification, "on" implies being positioned above or below a target element and does not imply being necessarily positioned on the top on the basis of a gravity direction.

Further, in the accompanying drawings, an active matrix (AM) organic light emitting diode display having a 2Tr-1Cap structure which includes two thin film transistors (TFTs) and one capacitor in one pixel is shown, but the present invention is not limited thereto. Therefore, the organic light emitting diode display can include three or more thin film transistors and two or more capacitors in one pixel and further include separate wiring, to thereby have various structures. Herein, the pixel is a minimum unit displaying an image and the organic light emitting diode display displays the image through a plurality of pixels.

Hereinafter, an embodiment of an organic light emitting diode display will be described with reference to FIGS. 1 to 4.

FIG. 1 is a cross-sectional view of an embodiment of an organic light emitting diode display.

As shown in FIG. 1, an embodiment of the organic light emitting diode display includes a substrate 100, a wiring unit 200, an organic light emitting diode 300, an adhesive layer 400, a metal layer 500, and a resin layer 600.

The substrate 100 includes glass and is made of a light-transmitting material. The wiring unit 200 and the organic light emitting diode 300 are positioned on the substrate 100 and the substrate 100 faces the metal layer 500 with the wiring unit 200 and the organic light emitting diode 300 interposed therebetween. The substrate 100 and the metal layer 500 are bonded and sealed to each other by the adhesive layer 400 with the organic light emitting diode 300 interposed therebetween. The substrate 100 and the metal layer 500 protect the wiring unit 200 and the organic light emitting diode 300 from the interference of the outside. In some embodiments, a thermal expansion coefficient of the substrate 100 can be about 3.8 ppm/° C., an elastic coefficient can be about 73000 Mpa, and a thickness t3 (shown in FIG. 4) can be in the range of about 0.7 mm to about 1.1 mm. The thermal expansion coefficient, the elastic coefficient, and the thickness of the substrate are not limited thereto and can be variously set according to the Equation 3 described below.

In some embodiments of the organic light emitting diode display, the substrate 100 includes glass, but other embodiments of the organic light emitting diode display satisfying Equation 3 below can have a substrate which can include a resin, a metal, or the like.

The wiring unit 200 includes first and second thin film transistors 10 and 20 (shown in FIG. 2) and drives the organic light emitting diode 300 by transmitting a signal to the organic light emitting diode 300. The organic light emitting diode 300 emits light according to a signal transmitted from the wiring unit 200.

The organic light emitting diode 300 is positioned on the wiring unit 200.

The organic light emitting diode 300 is positioned on the substrate 100 and displays images by the signal transmitted from the wiring unit 200.

Hereinafter, an inner structure of an embodiment of an organic light emitting diode display will be described in detail with reference to FIGS. 2 and 3.

Figure 2:
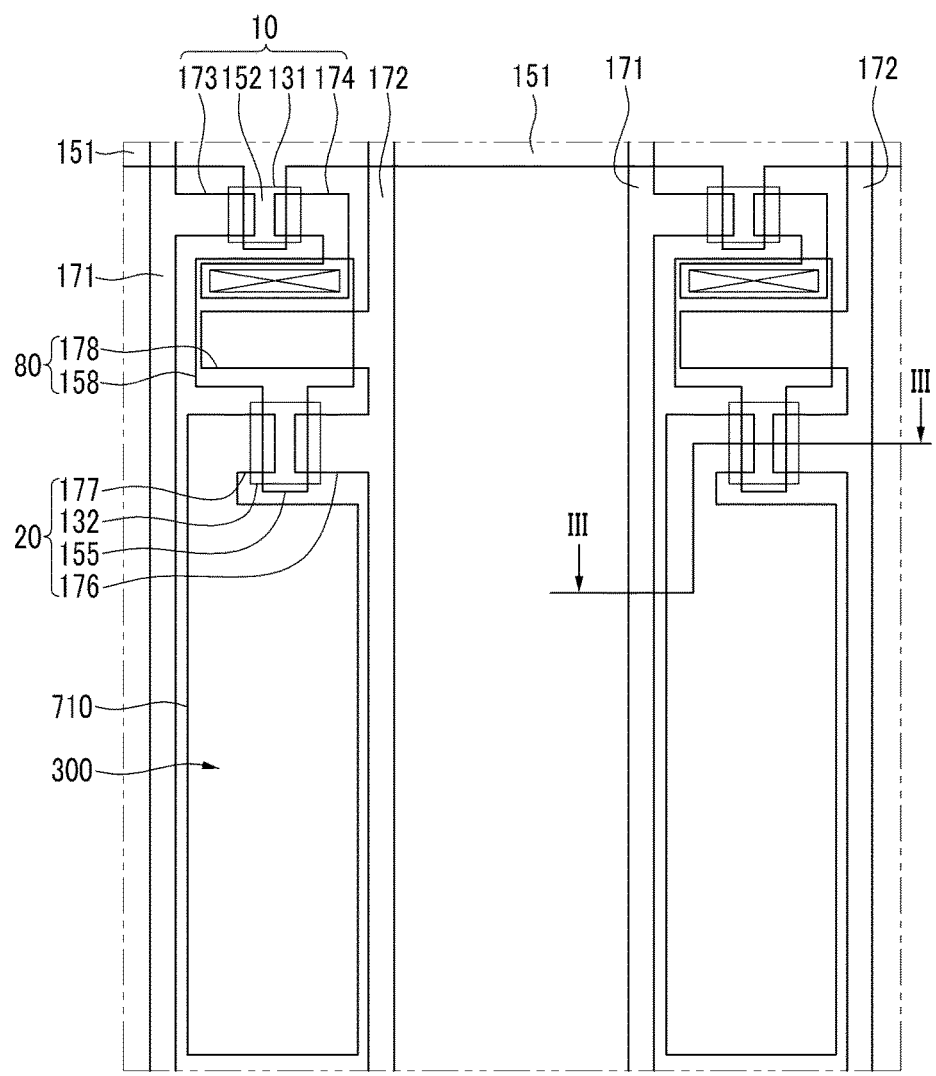
FIG. 2 is a layout view illustrating a structure of a pixel in an embodiment of an organic light emitting diode display.

FIG. 2 is a layout view illustrating a structure of a pixel in an embodiment of an organic light emitting diode display.

Figure 3:
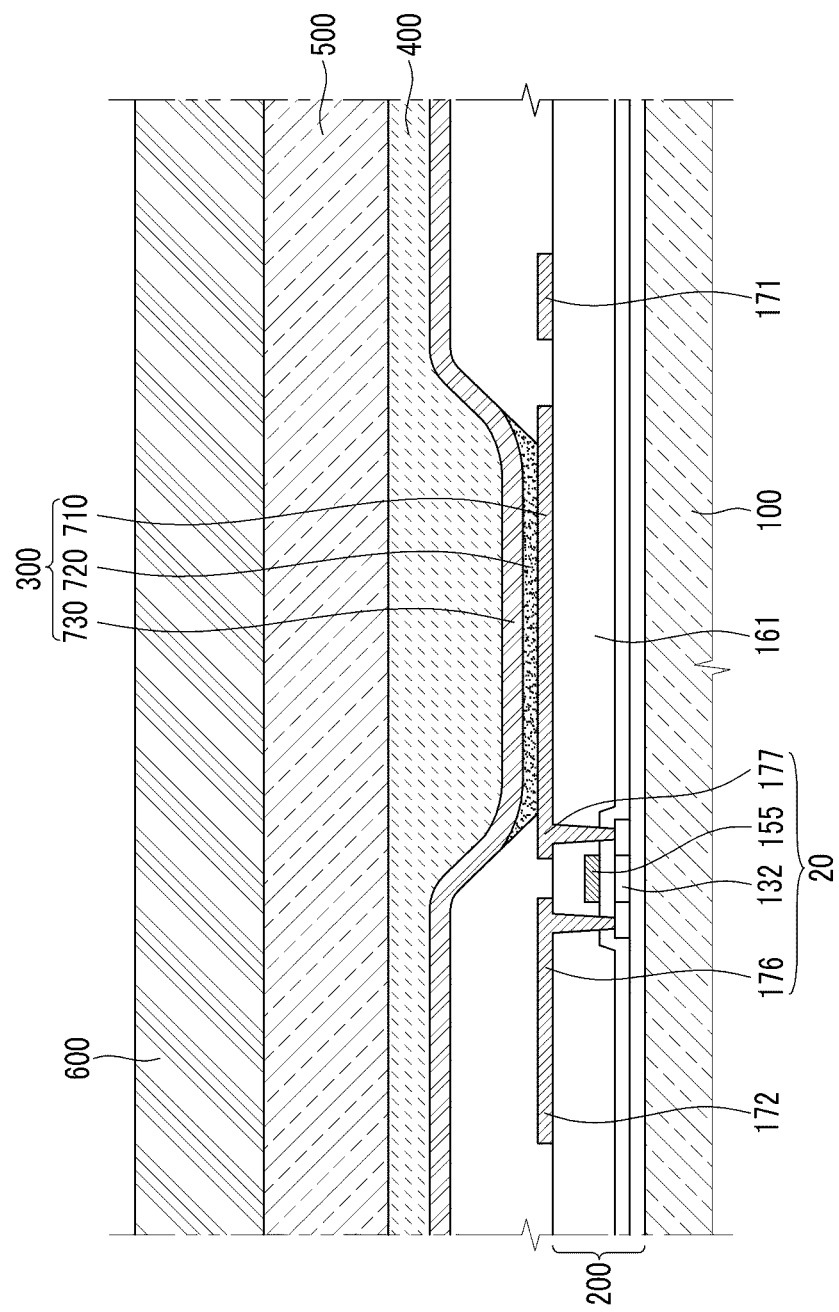
FIG. 3 is a cross-sectional view taken along line of FIG. 2.

FIG. 3 is a cross-sectional view taken along line of FIG. 2.

Hereinafter, detailed structures of the wiring unit 200 and the organic light emitting diode 300 are shown in FIGS. 2 and 3, but other embodiments are not limited thereto. The wiring unit 200 and the organic light emitting diode 300 can be formed by various structures in the range which can be easily modified by those skilled in the art.

As shown in FIGS. 2 and 3, the organic light emitting diode display includes a switching thin film transistor 10, a driving thin film transistor 20, a capacitor 80, and an organic light emitting diode 300 for each pixel. The wiring unit 200 includes the switching thin film transistor 10, the driving thin film transistor 20, and the capacitor 80. In addition, the wiring unit 200 can further include a gate line 151 disposed in one direction of the substrate 100, a data line 171 insulating and crossing the gate line 151, and a common power line 172. In some embodiments, a pixel can be defined by the boundary of the gate line 151, the data line 171 and the common power line 172.

The organic light emitting diode 300 includes a first electrode 710, an organic emission layer 720 formed on the first electrode 710, a second electrode 730 formed on the organic emission layer 720. The first electrode 710 can be an anode, which is a hole injecting electrode, and the second electrode 730 can be a cathode, which is an electron injecting electrode. In other embodiments, the first electrode 710 can be the cathode and the second electrode 730 can be the anode according to the driving method of the organic light emitting diode display. A hole and an electron are injected into the organic emission layer 720 from the first electrode 710 and the second electrode 730 respectively. When an exciton, in which the hole and the electron injected into the organic emission layer 720 are coupled to each other, falls from an excited state to a ground state, the organic emission layer 720 emits light. The first electrode 710 can be constituted by a light-transmissive structure and the second electrode 730 can be constituted by a light-reflective structure. Accordingly, the organic light emitting diode 300 emits light in a direction of the substrate 100.

The capacitor 80 includes a pair of capacitor plates 158 and 178 with an interlayer insulating layer 161 interposed therebetween. The interlayer insulating layer 161 acts as a dielectric and a capacitance of the capacitor 80 is determined by electric charges charged in the capacitor 80 and a voltage between capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element selecting a desired pixel to emit light. The switching gate electrode 152 is connected to the gate line 151. The switching source electrode 173 is connected to the data line 171. The switching drain electrode 174 is separated from the switching source electrode 173 and connected with capacitor plate 158.

The driving thin film transistor 20 applies a driving power in the selected pixel to the second electrode 730. The driving gate electrode 155 is connected with the capacitor plate 158 connected with the switching drain electrode 174. Each of the driving source electrode 176 and the other capacitor plate 178 is connected with the common power line 172. The driving drain electrode 177 is positioned on the same layer as the first electrode 710 and is connected with the first electrode 710.

According to the structure described above, the switching thin film transistor 10 is operated by a gate voltage applied to the gate line 151 and then acts to transmit a data voltage applied to the data line 171 to the driving thin film transistor 20. Voltage corresponding to a difference between the common voltage applied to the driving thin film transistor 20 from the common power line 172 and the data voltage applied from the switching thin film transistor 10 is stored in the capacitor 80. Current corresponding to the voltage stored in the capacitor 80 flows to the organic light emitting diode 300 through the driving thin film transistor 20 to emit the light in the organic light emitting diode 300.

Figure 4:
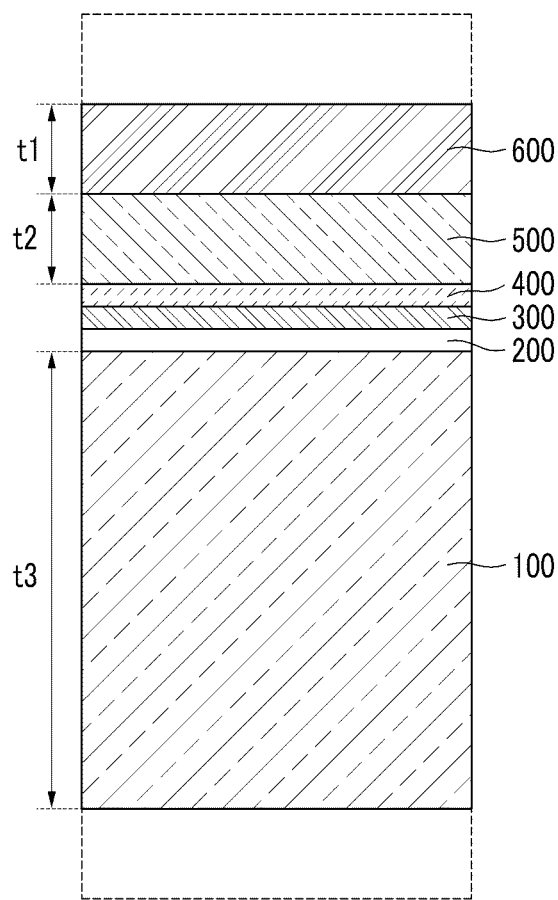
FIG. 4 is an enlarged view of portion A of FIG. 1.

FIG. 4 is an enlarged view of portion A of FIG. 1.

As shown in FIG. 4, adhesive layer 400 is positioned on the organic light emitting diode 300.

The adhesive layer 400 is positioned between the substrate 100 and the metal layer 500 with the organic light emitting diode 300 interposed therebetween. The adhesive layer 400 bonds and seals the substrate 100 and the metal layer 500 around an edge of the substrate 100. The adhesive layer 400 can include a thermosetting resin and is cured by heat.

The metal layer 500 is positioned on the substrate 100 with the adhesive layer 400 and the organic light emitting diode 300 interposed therebetween.

The metal layer 500, as an encapsulant encapsulating the organic light emitting diode 300 on the substrate 100, can be a nickel alloy including nickel and iron. More particularly, the metal layer 500 can include an invar including nickel of about 36% to about 42%, can have a lower thermal expansion coefficient than the substrate 100, and can have a smaller thickness than the substrate 100. In some embodiments, the thermal expansion coefficient of the metal layer 500 can be about 0.6 ppm/° C., the elastic coefficient can be about 140000 Mpa, and the thickness t2 can be in the range of about 0.05 mm to about 0.1 mm, but the thermal expansion coefficient, the elastic coefficient, and the thickness of the metal layer 500 are not limited thereto and can be variously set according to Equation 3 described below.

In come embodiments of the organic light emitting diode display, the metal layer 500 includes the invar. In other embodiments, the metal layer can include any metal or alloy that has a lower thermal expansion coefficient than glass.

A resin layer 600 is positioned on the metal layer 500.

The resin layer 600, as a reinforced member attached to the metal layer 500, and reinforcing the strength of the metal layer 500, can include engineering plastics including at least one of glass fiber reinforced plastic (FRP), polyethyleneterephthalate (PET), and polymethylmethacrylate (PMMA). The resin layer 600 can have a larger thermal expansion coefficient than the metal layer 500 and the substrate 100, and a substantially similar thickness to the metal layer 500. In some embodiments, the thermal expansion coefficient of the resin layer 600 can be between about 30 to about 60 ppm/° C., the elastic coefficient can be between about 3300 Mpa to about 11000 Mpa, and the thickness t1 can be between about 0.05 mm to about 0.1 mm. In other embodiments, the thermal expansion coefficient, the elastic coefficient, and the thickness of the resin layer 600 are not limited thereto and can be variously set according to Equation 3 described below.

In some embodiments of the organic light emitting diode display, the resin layer 600 can include engineering plastics including at least one of glass fiber reinforced plastic (FRP), polyethyleneterephthalate (PET), and polymethylmethacrylate (PMMA). In other embodiments, the resin layer can include various resin materials, as long as the organic light emitting diode display satisfies Equation 3 described below.

As described above, the metal layer 500 has a lower thermal expansion coefficient and a smaller thickness than the substrate. The resin layer 600 has a larger thermal expansion coefficient than the metal layer 500 and the substrate 100 and a substantially similar thickness to the metal layer 500. When heat used for curing the adhesive layer 400 is applied to the organic light emitting diode display in manufacturing the organic light emitting diode display, the deformation of the resin 600, the metal layer 500 and the substrate 100 due to the heat is minimized. That is, the deformation of the organic light emitting diode display is minimized in a heat-bonding process. This minimization of deformation was verified through experiments described below.

Hereinafter, experiments using embodiments of the organic light emitting diode display will be described with reference to FIGS. 5 to 11.

FIGS. 5 to 11 are diagrams describing experiments using an embodiment of an organic light emitting diode display.

Aluminum (Al), which is a metal encapsulant generally used, has a different thermal expansion coefficient from glass included in the substrate 100. Experiments show that the organic light emitting diode display is heat-deformed by heat used as a curing means of the adhesive layer 400 in the heat-bonding process of the substrate and the metal encapsulant using the adhesive layer 400. Accordingly, where a metal having a thermal expansion coefficient similar to glass is used as the metal encapsulant, it is expected that the organic light emitting diode display is not heat-deformed by the heat. However, since the metal having a thermal expansion coefficient similar to glass is costly and has a difficult development process, the experiments as described below were performed.

When the material used as the metal layer 500 is invar material having a lower thermal expansion coefficient than glass, and when the polyethyleneterephthalate (PET) is used as the resin layer 600 reinforcing the strength of the metal layer 500, experiments show that the thermal expansion between the substrate 100 and the metal layer 500 and the resin layer 600 is balanced in the heat-bonding process using the adhesive layer 400, such that the entire thermal deformation amount and thermal deformation stress is minimized.

Accordingly, the encapsulant bonding the metal layer 500 and the resin layer 600 is an IN-PET. The combination of the thicknesses suitable to the thermal expansion of the glass which is the substrate 100 was drawn by using experiments as described below by adjusting the invar and the thickness of the PET in the IN-PET.

Figure 5:
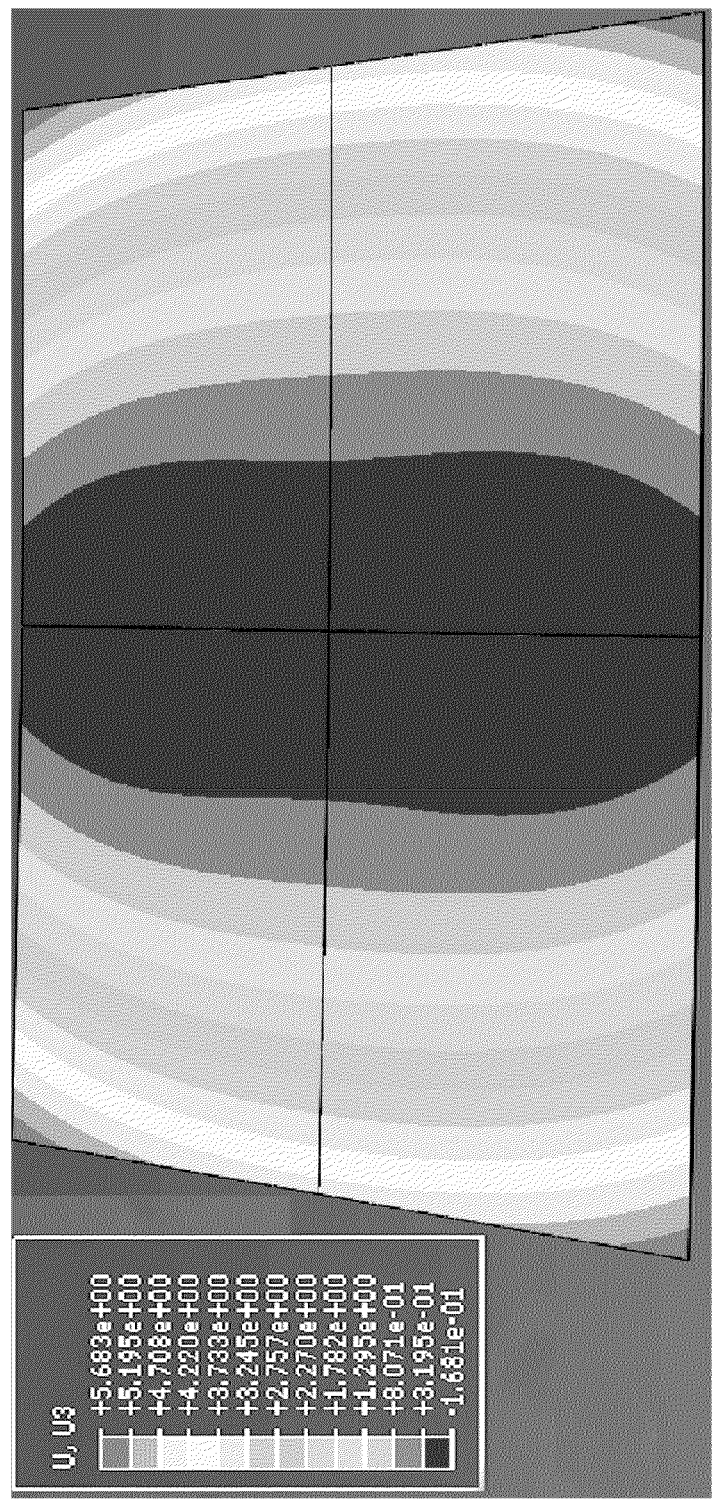

FIG. 5 shows the case where the IN-PET is applied to the organic light emitting diode display having vertical and horizontal widths of about 730 mm and about 920 mm, respectively simulated by using Abaqus which is structural, electric and thermal analyzing tools sold by the SIMULIA of Dassault Systems co., Ltd. Hereinafter, t as a thickness is expressed in units of mm.

As shown in FIG. 5, when an invar of 0.1 t and PET of 0.1 t was entirely bonded to a glass of 1.1 t, the organic light emitting diode display showed a high deformation stress in only four small corner portions. Therefore, the organic light emitting diode display had entirely and considerably small thermal deformation amount. This case, where the organic light emitting diode display had considerably small thermal deformation amount over all and was deformed at four corner portions, is called a C deformation mode. The case where the organic light emitting diode display had a high deformation stress at an edge or throughout and had considerably large thermal deformation amount over all based on a virtual Y-axis is called a Y deformation mode. An X deformation mode is the case where there is only a different axial direction generating the deformation from the Y deformation mode and the organic light emitting diode display had considerably large thermal deformation amount over all based on a virtual X-axis crossing the virtual Y-axis like the Y deformation mode.

As a comparative example, the thermal deformation amount and the thermal stress of the organic light emitting diode display were experimented in the case where only aluminum polyethyleneterephthalate (Al-PET) or aluminum (Al Sheet) was applied as the encapsulant under the heat-bonding process of the same condition. Results of that experiment are illustrated in the Table shown in FIG. 6.

In FIG. 6, metal t is a thickness of a metal of the encapsulant, PET t is a thickness of PET of the encapsulant, glass t is a thickness of the substrate, cooling deformation is a thermal deformation amount of the organic light emitting diode display when the temperature is cooled from about 100° C. to Tf. The deformation modes Y, C and X are those described above. Glass stress is a thermal stress generated in the substrate, and a metal stress is a thermal stress generated in the metal layer.

As shown in FIG. 6, the comparative examples had considerably high cooling deformations and were very difficult to be used as the encapsulant of the organic light emitting diode display as compared with the IN-PET as the encapsulant.

In the case of a glass thickness of 1.1 t, when the thicknesses of the invar were 0.1 t and 0.05 t, respectively, a proper thickness of PET was experimented. This is illustrated in a table shown in FIG. 7.

As shown in FIG. 7, as the thickness of the invar was smaller, the thickness of PET was smaller at the same ratio, a minimum thermal deformation amount was generated in the organic light emitting diode display.

Further, in the case of a glass thickness 0.7 t, when the thicknesses of the invar were 0.1 t and 0.05 t, respectively, a proper thickness of PET was experimented. This is illustrated in a table shown in FIG. 8.

As shown in FIG. 8, the thicknesses of PET corresponding to the thicknesses of the invar of 0.1 t and 0.05 t, respectively, in which the minimum thermal deformation amount was generated in the organic light emitting diode display, were 0.1 t and 0.05 t, respectively. That is, in the case of PET, a thickness ratio of the invar and PET was properly 1:1 regardless of the thickness of the glass, but as shown in FIGS. 7 and 8, in the case of a small thickness of the glass, the thermal deformation amount generated in the organic light emitting diode display in the heat-bonding process was further sensitive to the ratio between the invar thickness and the PET thickness.

The case where various resin materials are applied to the resin layer was experimented. FIG. 9 is a Table illustrating property values of glass fiber reinforced plastic (FRP), polyethyleneterephthalate (PET), and polymethylmethacrylate (PMMA) applied to the resin layer, a property value of glass applied to the substrate, and a property value of invar applied to the metal layer. FIG. 10 is a Table illustrating a thermal deformation amount and a thermal stress of an organic light emitting diode display generated in the heat-bonding process, in the case where a generally used resin such as FRP or PMMA laminated in the INVAR is used as an encapsulant.

As shown in FIG. 10, in the case of the resin layer of FRP, the thermal deformation amount and the thermal stress of the organic light emitting diode display generated in the heat-bonding process were minimally generated with the thickness of FRP 1 to 1.5 times larger than the thickness of invar. In the case of the resin layer of PMMA, the thermal deformation amount and the thermal stress of the organic light emitting diode display generated in the heat-bonding process are minimally generated with the thickness of PMMA 2.5 times larger than the thickness of invar.

Accordingly, as the thermal expansion coefficient and elastic coefficient was increased, the thickness of the resin layer was decreased and a thermal expanding force of a material was directly proportional to a thermal expansion coefficient a, an elastic coefficient E, and a thickness t. The thermal expanding force is a*E*t.

Therefore, the following relationship exists in order to balance the thermal expansion between the resin layer of PET, PMMA and FRP, the metal layer of invar, and the substrate of glass. When an effective thermal expansion coefficient of a composite material in which the resin layer and the metal layer are attached to each other is θ, θ satisfies the following equation 1:

$$\theta=(E1*a1*t1+E2*a2*t2)/(E1*t1+E2*t2) \quad \text{Equation 1}$$

where, t1 is a thickness of the resin layer, a1 is a thermal expansion coefficient of the resin layer, E1 is an elastic coefficient of the resin layer, t2 is a thickness of the metal layer, a2 is a thermal expansion coefficient of the metal layer, E2 is an elastic coefficient of the metal layer, and θ is an effective thermal expansion coefficient of a composite material in which the resin layer and the metal layer are attached to each other.

If the effective thermal expansion coefficient θ is similar to the thermal expansion coefficient of the substrate of glass, since the thermal expansion amount is similar in the heat-bonding process, the thermal deformation or the thermal stress of the organic light emitting diode display due to the heat can be minimized.

When the property values shown in FIG. 9 were substituted in the Equation 1, the effective thermal expansion coefficient=(0.6*140000+60*5300)*0.1/(140000+5300) *0.1=2.8 ppm/° C. was drawn. This is similar to the thermal expansion coefficient of the substrate of about 3.8 ppm/° C. and when the t2 was fixed to 0.1 t, the thickness of PET had a value closest to about 3.8 ppm/° C. at 0.15 t.

According to the experiments described above, when the thickness t2 of invar was 0.1 t and the thickness t1 of PET was 0.1 t, the thermal deformation of the organic light emitting diode display was minimized, but although a simple effective property equation such as Equation 1 was used, the thickness of the resin layer could be expected. Furthermore, although other resin PMMA or FRP other than PET was used in the resin layer, when Equation 1 was used, the thickness could approximately be expected. When the results drawn in the above-described experiments and the result using Equation 1 were compared, the results had a little difference, but were mostly equal to each other such that the method calculated through the equation 1 could be used to calculate the thickness t1 of the general resin layer.

When the effective thermal expansion coefficient θ of a composite material in which the resin layer and the metal layer are attached to each other is substituted in Equation 1 by being replaced with the thermal expansion coefficient a3 of the substrate, Equation 2 obtaining the thickness t1 of the resin layer is modified from the equation 1.

$$t1=\{E2*t2*(a3-a2)\}/\{E1*(a1-a3)\} \qquad \text{Equation 2}$$

When the method of simply calculating the thickness by the equation 2 was performed within ±50% based on the value set in Equation 2 to consider a little error, the thickness t1 of the resin layer satisfied the following Equation 3, such that embodiments of the organic light emitting diode display satisfied the following Equation 3.

$$[\{E2*t2*(a3-a2)\}/\{E1*(a1-a3)\}]*0.5 \le t1 \le [\{E2*t2*(a3-a2)\}]/[\{E1*(a1-a3)\}]*1.5 \qquad \text{Equation 3}$$

t1 is a thickness of the resin layer, a1 is a thermal expansion coefficient of the resin layer, E1 is an elastic coefficient of the resin layer, t2 is a thickness of the metal layer, a2 is a thermal expansion coefficient of the metal layer, E2 is an elastic coefficient of the metal layer, and a3 is a thermal expansion coefficient of the substrate.

The thickness of the resin layer drawn by using Equation 2 and Equation 3 and the thickness of the resin layer drawn by the experiment are shown as a Table in FIG. 11.

As shown in FIG. 11, the thickness of the resin layer drawn by the experiment was similar to the thickness of the resin layer drawn by using the equation 2 and was in the range of the thickness of the resin layer drawn by using the equation 3.

Embodiments of the organic light emitting diode display satisfy Equation 3 in the state which the thermal expansion coefficient of the metal layer 500 is lower than the thermal expansion coefficient of the substrate 100, such that the entire thermal deformation amount and the thermal deformation stress of the organic light emitting diode display generable in the heat-bonding process using the adhesive layer 400 are minimized.

In embodiments of the organic light emitting diode display, the resin layer 600 such as PET or the like, having a lower material cost than the metal layer 500, is used as a maximum encapsulant and the metal layer 500 such as invar or the like, having a higher material cost than the resin layer 600, is used as a minimum encapsulant, such that the manufacturing cost of the organic light emitting diode display can be reduced.

In embodiments of the organic light emitting diode display, the metal layer 500 originally prevents a moisture transmittable into the organic light emitting diode 300 and a mechanical strength of the metal layer 500 is reinforced by the resin layer 600, such that the reliability of the organic light emitting diode display can be improved.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
a substrate;
a wiring unit positioned on the substrate;
an organic light emitting diode positioned on the wiring unit;
a metal layer positioned on the organic light emitting diode and having a lower thermal expansion coefficient than a thermal expansion coefficient of the substrate;
an adhesive layer positioned between the organic light emitting diode and the metal layer; and
a resin layer positioned on the metal layer to reinforce a strength of the metal layer,
wherein the resin layer has a higher thermal expansion coefficient than the substrate and the metal layer,
wherein: the organic light emitting diode display satisfies the following equation:

$$[\{E2*t2*(a3-a2)\}/\{E1*(a1-a3)\}]*0.5 \le t1 \le [\{E2*t2*(a3-a2)\}]/[\{E1*(a1-a3)\}]*1.5$$

where, t1 is a thickness of the resin layer, a1 is the thermal expansion coefficient of the resin layer, E1 is an elastic coefficient of the resin layer, t2 is a thickness of the metal layer, a2 is the thermal expansion coefficient of the metal layer, E2 is an elastic coefficient of the metal layer, and a3 is the thermal expansion coefficient of the substrate, and
wherein the organic light emitting diode contacts the adhesive layer, the adhesive layer contacts the metal layer, and the metal layer contacts the resin layer in a region where the wiring unit, the organic light emitting diode, the adhesive layer, the metal layer, and the resin layer overlap one another in a direction perpendicular to the substrate.

2. The organic light emitting diode display of claim 1, wherein: the adhesive layer contacts the metal layer along the entire length of the metal layer.

3. The organic light emitting diode display of claim 1, wherein: the substrate comprises glass and the metal layer comprises nickel and iron.

4. The organic light emitting diode display of claim 3, wherein: the thermal expansion coefficient of the substrate is about 3.8 ppm/° C., the elastic coefficient of the substrate is about 73000 Mpa, and a thickness of the substrate is in the range of about 0.7 mm to about 1.1 mm.

5. The organic light emitting diode display of claim 4, wherein: the thermal expansion coefficient of the metal layer is about 0.6 ppm/° C., the elastic coefficient of the metal layer is about 140000 Mpa, and the thickness of the metal layer is in the range of about 0.05 mm to about 0.1 mm.

6. The organic light emitting diode display of claim 3, wherein: the resin layer includes at least one of glass fiber reinforced plastic (FRP), polyethyleneterephthalate (PET), and polymethylmethacrylate (PMMA).

7. The organic light emitting diode display of claim 6, wherein: the thermal expansion coefficient of the resin layer is between about 30 to about 60 ppm/° C., the elastic coefficient of the resin layer is between about 3300 Mpa to about 11000 Mpa, and the thickness of the resin layer is in the range of about 0.05 mm to about 0.1 mm.

8. The organic light emitting diode display of claim 1, wherein: the adhesive layer is configured to bond and seal the substrate and the metal layer with each other.

9. The organic light emitting diode display of claim 8, wherein: the adhesive layer comprises a thermosetting resin.

10. The organic light emitting diode display of claim 1, wherein a thickness of the substrate is in the range of about 0.7 mm to about 1.1 mm, the thickness of the metal layer is in the range of about 0.05 mm to about 0.1 mm, and the thickness of the resin layer is in the range of about 0.05 mm to about 0.1 mm.

* * * * *